(12) United States Patent
Sim et al.

(10) Patent No.: US 6,456,555 B2
(45) Date of Patent: Sep. 24, 2002

(54) VOLTAGE DETECTING CIRCUIT FOR SEMICONDUCTOR MEMORY DEVICE

(75) Inventors: Jae-Yoon Sim; Jei-Hwan Yoo, both of Kyunggi-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 32 days.

(21) Appl. No.: 09/747,860

(22) Filed: Dec. 22, 2000

(30) Foreign Application Priority Data

May 30, 2000 (KR) .............................. 00-29353

(51) Int. Cl.[7] ................................................ G11C 5/14
(52) U.S. Cl. .............. 365/226; 365/189.07; 365/189.09
(58) Field of Search ........................... 365/226, 189.09, 365/189.11, 189.07, 185.23

(56) References Cited

U.S. PATENT DOCUMENTS

| | | | |
|---|---|---|---|
| 5,377,156 A | * 12/1994 | Watanabe et al. | 365/189.09 |
| 5,446,697 A | * 8/1995 | Yoo et al. | 365/189.07 |
| 6,154,411 A | * 11/2000 | Morishita | 365/226 |
| 6,285,622 B1 | * 9/2001 | Haraguchi et al. | 365/226 |

* cited by examiner

Primary Examiner—Tan T. Nguyen
(74) Attorney, Agent, or Firm—Marger Johnson & McCollom, P.C.

(57) ABSTRACT

A voltage detecting circuit includes first and second reference voltage generating circuits. The first reference voltage generating circuit provides a reference voltage during a normal operation mode. The second reference voltage generating circuit provides a reference voltage during a test mode. A comparison voltage generating circuit is also included and provides a comparison voltage during both modes in response to a boosted voltage. A differential amplifier circuit is further included in the voltage detecting circuit. The differential amplifier generates an amplified difference signal that is used to generate a voltage level detection signal. The voltage level detection signal controls a pumping operation for generating the boosted voltage level. A bypass circuit may also be provided to lower a detected boosted voltage level and allow operation at lower voltage levels. The voltage detecting circuit according to this invention is unaffected by process and temperature variations and allows precise and stable voltage detection in either operation mode.

31 Claims, 7 Drawing Sheets

112,113
122,123
201,202
122a,113a (first, second, third embodiment)

(fourth embodiment)

VOLTAGE DETECTING CIRCUIT FOR SEMICONDUCTOR MEMORY DEVICE

This application relies for priority upon Korean Patent Application No. 2000-29353, filed on May 30, 2000, the contents of which are herein incorporated by reference in their entirety.

FIELD OF THE INVENTION

The present invention relates to voltage detecting circuits for use in semiconductor memory devices, and more particularly, to a boosted voltage detecting circuit for detecting a stable boosted voltage level in semiconductor memory devices.

BACKGROUND OF THE INVENTION

High-capacity semiconductor memory devices, such as dynamic random access memories (DRAMs), utilize a low voltage power supply to decrease power consumption and increase reliability. In such devices, it is desirable to utilize a boosted voltage (VPP) to improve the transfer characteristics of certain circuits. For example, in order to ensure accurate and reliable operation of word line driver circuits, a boosted voltage VPP is used as the power supply voltage to drive word line voltages higher than the low voltage level of the low voltage power supply.

In a semiconductor memory device, a VPP generator is used to generate the boosted voltage VPP. The VPP generator includes a pumping circuit driven by an oscillator, and a VPP level detecting circuit that controls the operation of the oscillator. The VPP level detecting circuit detects the VPP level that is usually determined by the usage of the VPP voltage and compares it to a target VPP level. When the VPP level reaches the target level, the detecting circuit activates a detection signal that causes the oscillator to stop operating. This, in turn, causes the pumping circuit to stop pumping. While the pumping circuit is deactivated, as the VPP is used as a power source, the VPP voltage level drops. When the VPP voltage level drops below the target VPP level, the detecting circuit deactivates the detection signal, causing the pumping circuit to resume pumping.

When using a boosted voltage VPP, it is important to get an exact target level because an unnecessarily higher or lower VPP level than the target level may result in increased power consumption, increased stress to the device, and poor transistor performance. A precise and stable detecting circuit is therefore required.

A conventional VPP level detecting circuit of a semiconductor memory device is illustrated in FIG. 1. Referring to FIG. 1, the detecting circuit includes a voltage generator 10 for generating a comparison voltage, and a driving circuit 20 for detecting a target VPP level and for generating a voltage level detection signal (DET). The voltage generator 10 includes serially-connected NMOS transistors 11, 12, and 13. One end of the voltage generator 10 is coupled to a power supply voltage (VDD), and an opposite end is coupled to a ground voltage (VSS). A gate of transistor 12 is connected to the power supply voltage VDD, and gates of transistors 11 and 13 are connected to the boosted voltage VPP. The driving circuit 20 includes three inverters 21, 22, and 23. An input of inverter 21 is connected to node A. Assuming that the equivalent resistance values of the source drain path of transistors 11, 12, and 13, are R1, R2, and R3, respectively, then the voltage of node A can be expressed by the equation:

$$VA=VDD*\{(R2+R3)/(R1+R2+R3)\}.$$

As the boosted voltage VPP level increases, the resistance values of transistors 11 and 13 decrease because their gates are connected to the boosted voltage VPP. The resistance value of transistor 12, however, remains almost unchanged because its gate is connected to the power supply voltage VDD, which has a specific and fixed value. As the boosted voltage VPP level increases, therefore, the voltage level of node A also increases.

A logic threshold voltage of a P-type MOS (PMOS) or an N-type MOS (NMOS) inverter is determined by its width/length ratio. An inverter starts to change its output state around the logic threshold voltage. If the voltage level of node A is higher than the logic threshold voltage level of inverter 21, therefore, the voltage level detection signal DET, output from inverter 23, becomes low and a pumping operation is stopped by the voltage level detection signal DET. If the voltage level of node A is lower than the logic threshold voltage, however, the voltage level detection signal DET becomes high and the pumping operation resumes. To implement the target VPP level detection operation, the voltage level of node A at the target VPP level may be adjusted to around the logic threshold voltage of inverter 21 by controlling the sizes of transistors 11, 12, and 13, and the inverter 21.

Unfortunately, the conventional detecting circuit described above has a number of drawbacks. Among other things, this detecting circuit is sensitive to process and temperature variations. The voltage of node A at the target VPP level and the logic threshold voltage of the inverter 21, for instance, vary with process and temperature variations. It is also possible for process and temperature variations to cause these two voltages to be shifted in different directions from each other because the inverter 21 includes both PMOS and NMOS transistors, and the voltage generator 10 only includes NMOS transistors. Because of these problems, the target VPP level may not be able to be accurately detected.

Variation of the detected VPP level due to process and temperature variations is even more serious during the high voltage test mode (such as a burn-in test mode) in comparison to a normal operation mode (such as a normal read or write mode). Another problem during high voltage tests is that it is difficult to get a target VPP level suitable for a high voltage test mode since the resistance value of the voltage generator 10 is designed for the normal operation mode.

Finally, the voltage gain of node A resulting from responding to the variation of the VPP level is so small (0.1–0.2) that variation of the logic threshold voltage due to process and temperature variations can critically vary the detected VPP level. In other words, the variation of node A voltage resulting from responding to the variation of VPP is relatively so small in comparison to the variation of logic threshold voltage of inverter 21 due to the process and temperature variations that a precise detection operation cannot be implemented using the prior art configuration.

SUMMARY OF THE INVENTION

It is therefore an object of the present invention to provide a voltage detecting circuit capable of precisely and reliably detecting a target voltage level.

It is another object of the invention to provide a voltage detecting circuit that is unaffected by process and temperature variations.

It is still another object of the invention to provide a voltage detecting circuit capable of detecting a target voltage level suitable for both a normal operation mode and a test mode in response to an operation mode signal.

In order to attain the above objects, according to one embodiment of the present invention, a voltage detecting circuit includes a first voltage generator coupled to a first power supply voltage to provide a reference voltage. A second voltage generator is coupled to a second power supply voltage to provide a comparison voltage. A differential amplifier receives both the reference voltage and the comparison voltage and amplifies a voltage difference between the reference and comparison voltages. A driving circuit receives the amplified difference voltage and generates a voltage level detection signal. The reference voltage generated in the first voltage generator is variable in response to an operation mode signal.

According to another aspect of this invention, the first voltage generator includes a first reference voltage generating circuit for providing a first reference voltage in response to the operation mode signal during a normal operation mode of a semiconductor memory device, and a second reference voltage generating circuit for providing a second reference voltage in response to the operation mode signal during a test mode of the semiconductor memory device. The first and second reference voltages are each provided to the differential amplifier as the reference voltage relating to the comparison voltage. In addition, the first and second voltage generators operate complementary to each other.

According to another aspect of this invention, a bypass circuit is coupled to an output of the differential amplifier. The bypass circuit lowers the detected boosted voltage level in a power supply voltage range between a normal power supply voltage and test power supply voltage level. The power supply voltage value between the normal and test power supply voltage levels can consequently be used as another test power supply voltage value without adding an additional voltage divider.

As is apparent from the foregoing, according to the voltage detecting circuit of the invention, a stable and precise detection operation can be performed that is unaffected by process and temperature variations. According to the voltage detecting circuit of the invention, the target boosted voltage VPP levels suitable for both the normal operation mode and the test mode can be obtained in response to an operation mode signal.

BRIEF DESCRIPTION OF THE DRAWINGS

The present invention, as well as its preferred modes of use, and further objects and advantages thereof, will best be understood by reference to the following detailed description of illustrative embodiments made with reference to the accompanying drawings—in which like numerals represent like elements—wherein.

DESCRIPTION OF THE PREFERRED EMBODIMENT

The present invention will now be described more fully. Although various preferred embodiments of the invention are shown and described, it should be readily apparent that this invention may be modified in arrangement and detail and should therefore not be construed as being limited to the embodiments set forth herein. Rather, the specific embodiments are given to provide a thorough and complete disclosure, and to convey the scope and importance of the invention to those skilled in the art.

Figure 1:
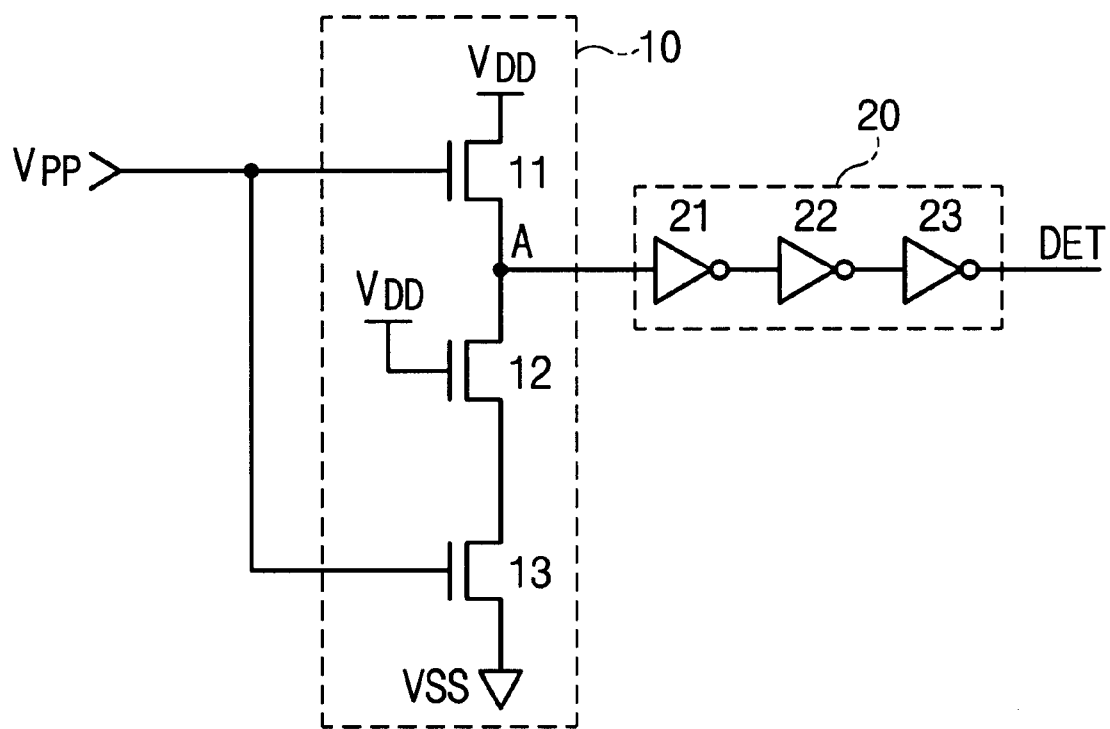
FIG. 1 is a schematic circuit diagram illustrating a conventional voltage detecting circuit.
Figure 2:
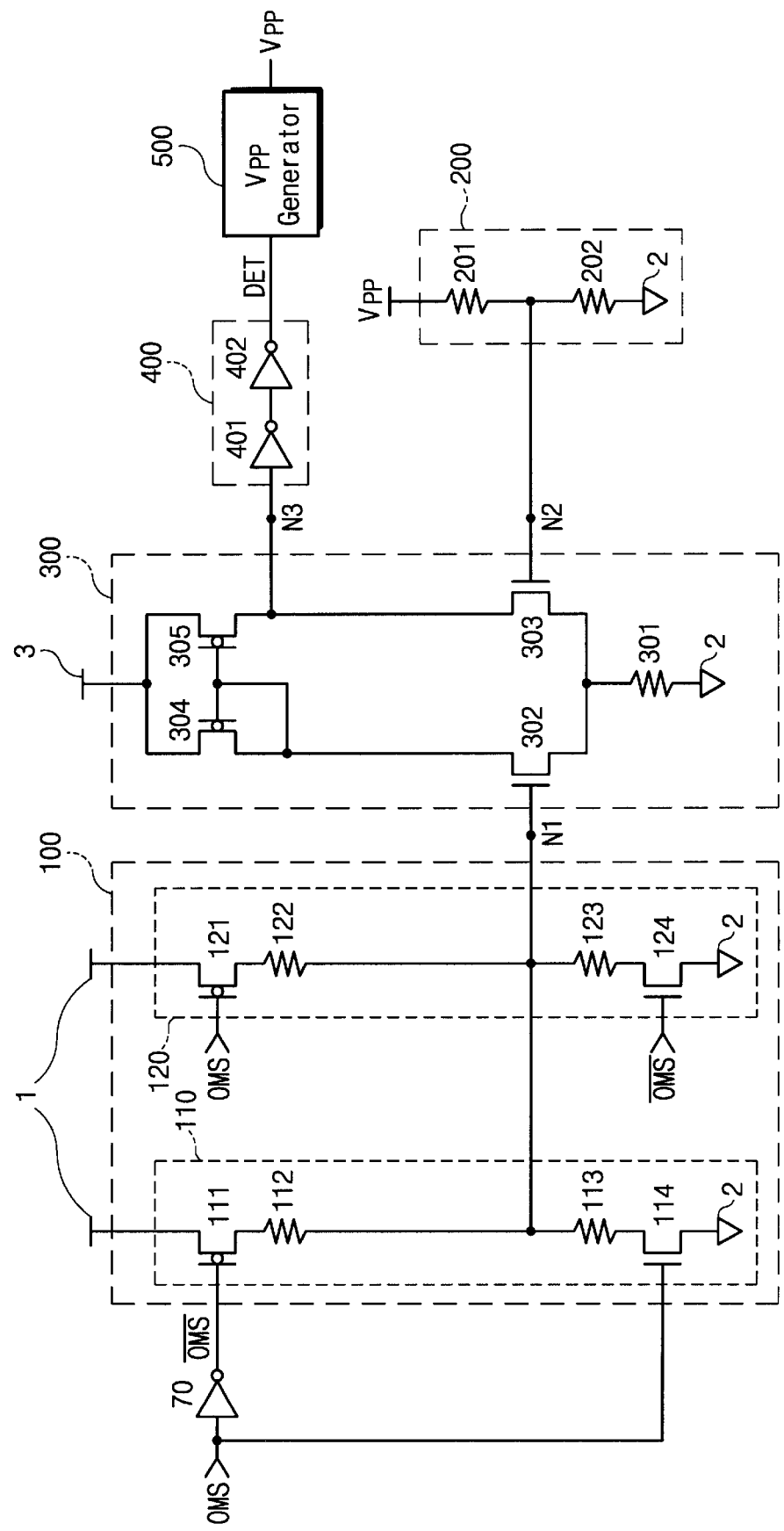
FIG. 2 is a schematic circuit diagram illustrating a first embodiment of a voltage detecting circuit according to the present invention.

Referring first to FIG. 2, a voltage detecting circuit according to a first preferred embodiment of the invention includes a first voltage generator 100, a second voltage generator 200, and a differential amplifier 300. An output of the first voltage generator 100 is connected to one input N1 of the differential amplifier 300. An output of the second voltage generator 200 is connected to the other input N2 of the differential amplifier 300. A driving circuit 400 is coupled to an output N3 of the differential amplifier 300 and the input of a VPP generator 500 is coupled to an output DET of the driving circuit 400.

The first voltage generator 100 comprises first and second reference voltage generating circuits 110 and 120, respectively. The first reference voltage generating circuit 110 includes two switches 111 and 114. A first switch 111 is coupled to a power supply voltage 1 and a second switch 114 is coupled to a ground voltage 2. The first voltage generator 100 also includes a voltage divider having two resistors 112 and 113 that are coupled between the two switches 111 and 114. The second reference voltage generating circuit 120 also includes two switches 121 and 124. A first switch 121 is coupled to the power supply voltage 1. The second switch 124 is coupled to the ground voltage 2. A voltage divider that includes two resistors 122 and 123 is coupled between the two switches 121 and 124.

The first and second reference voltage generating circuits 110 and 120 generate two reference voltages which are transferred to the differential amplifier 300 via a common reference input node N1. The switches 111, 114, 121, and 124 of the first and second reference voltage generating circuits 110 and 120 are controlled by an operation mode signal (OMS) to indicate whether an operation mode of a memory device is a normal mode or a test mode. In this embodiment, the OMS signal is in a high state during the test mode and a low state during the normal operation mode.

In the test mode, since the switches 111 and 114 turn on, the first reference voltage generating circuit 110 provides a reference voltage suitable for the test mode. The switches 121 and 124 are off, and the second reference voltage generating circuit 120 therefore has no influence on the reference voltage. During the normal operation mode, however, the switches 121 and 124 are on and the second reference voltage generating circuit 120 provides a reference voltage suitable for the normal operation mode. The switches 111, 114, 121, and 124 can be implemented by various kinds of MOS transistor switches according to the nature (whether positive-true or negative-true logic) of the OMS signal.

The second voltage generator 200 includes a voltage divider that has two resistors 201 and 202 coupled between a boosted voltage VPP level and the ground voltage 2. The voltage divider provides a comparison voltage as a comparison input into terminal N2 of the differential amplifier 300. The comparison voltage represents variations in the boosted voltage VPP level.

The differential amplifier 300 includes a resistor 301, two NMOS transistors 302 and 303, and two PMOS transistors 304 and 305. The differential amplifier 300 is coupled between a power supply voltage 3 and the ground voltage 2. The resistor 301 acts as a current source and may be implemented by one or more MOS transistors.

The power supply voltage 3 may be either identical to, or different from, the power supply voltage 1, depending on noise considerations. In high density memory devices, it is desirable to use a separate power supply voltage for the cell array to reduce the amount of noise created in the circuit by the power supply voltage. For example, cell arrays are often sensitive to the noise of a power supply voltage and therefore frequently require a stable power supply. For cell arrays that require a stable power supply, the power supply voltage for the cell array can be separated from the power supply voltage for peripheral circuitry where more power supply voltage noise occurs. In the preferred embodiment, the power supply voltage for the cell array is coupled to the first voltage generator 100 for the generation of a more stable reference voltage. The power supply voltage for the peripheral circuitry is supplied to the remaining circuits of the present invention. Where noise problems are not serious, the power supply voltage for the peripheral circuitry can also be used for the cell array and other circuits of the present invention.

In operation, the differential amplifier 300 compares the comparison voltage at one input (N2) with the reference voltage at the other input (N1). The reference voltages at node N1 in the normal operation and test modes, and the comparison voltage at node N2 can be expressed by the following equations:

$VN1\text{normal}=VDD(\text{normal})*R(123)/\{R(122)+R(123)\}$;

$VN1\text{test}=VDD(\text{test})*R(113)/\{R(112)+R(113)\}$;

and $VN2=VPP*R(202)/\{R(201)+R(202)\}$.

These equations accurately reflect the node voltages since the on-resistance of each of the switches 121, 124, 111, and 114 is negligible. The power supply voltage VDD is fixed according to the mode of operation (i.e., 3 V in the normal operational mode, 6 V in the test mode). As can be seen from the foregoing equations, because the power supply voltage VDD value is fixed, the reference voltage does not change in a given operation mode. The differential amplifier 300 generates an amplified difference signal at an output (N3) based on a comparison of the reference voltage at node N1 to the comparison voltage at node N2. If the comparison voltage is higher than the reference voltage, an amplified low level voltage is generated. If the comparison voltage is lower than the reference voltage, an amplified high level voltage is generated.

The driving circuit 400 includes two inverters 401 and 402 connected together in series. The inverter 401 detects the amplified difference signal by comparing the input signal with the logic threshold voltage of inverter 401. When the amplified low-level voltage is generated at the output N3, the inverter 401 detects the low level and changes its output state from low to high. When the amplified high-level voltage is generated at the output N3, the inverter 401 detects the high level and changes its output state from high to low. The inverter 402 is provided to generate a voltage level detection signal (DET) that has a sharp transition waveform and a full power supply voltage VDD level swing. Since the output of inverter 401 changes its output state slowly and its high or low states does not represent the full power supply voltage VDD level, a high state output from the inverter 402 is lower than the power supply voltage VDD level and a low state output from the inverter 402 is higher than the ground voltage. If necessary, additional inverters can be added to buffer the output of the inverters 401 and 402.

The VPP generator 500 operates in response to the voltage level detection signal DET and includes a conventional oscillator and pumping circuit. In the normal operation mode, the Operation Mode Signal (OMS) level is low and the second reference voltage generating circuit 120 is activated. It should be noted that the reference voltage of node N1 can be properly controlled by selecting the resistance values of resistors 122 and 123 that correlate to the voltage level of node N2 at a target VPP level for the normal operation mode.

In initial chip operation, the boosted voltage VPP level is low since the pumping operation of the VPP generator 500 does not instantaneously raise the boosted voltage VPP level to the target VPP level. The comparison voltage level at node N2 is therefore lower than the reference voltage level at node N1 and the output N3 of the differential amplifier 300 and the voltage level detection signal DET are both at a high level. The VPP generator 500 therefore continues the pumping operation to boost the boosted voltage VPP level in response to the high level voltage detection signal DET. When the pumping operation causes the boosted voltage VPP level to reach the target level, the comparison voltage level at node N2 becomes higher than the reference voltage level at node N1. The output N3 of differential amplifier 300 and the voltage detection signal DET consequently become low level signals and the VPP generator 500 stops the pumping operation in response to the low level DET signal. Thereafter, when the boosted voltage VPP level falls below the target level, the voltage detection signal DET again goes high and the VPP generator 500 resumes the pumping operation in response to the high level voltage detection signal DET.

When operating in the test mode, the operation mode signal OMS level is high and the first reference voltage generating circuit 110 is activated. The reference voltage of node N1 for the test mode can be controlled by selecting the resistance values of resistors 112 and 113 in light of the desired voltage level of node N2 at a target VPP level. The remaining operation of the test mode is the same as that of the normal operation mode, and the detailed explanation will therefore be omitted. By controlling the resistance values of resistors 112 and 113 independently of resistors 122 and 123, reference voltages can be provided to obtain suitable target VPP levels for both the normal operation and high voltage test modes. This invention thereby overcomes the problems in the prior art resulting from having a voltage generator suitable only for the normal operation mode.

Figure 3A:
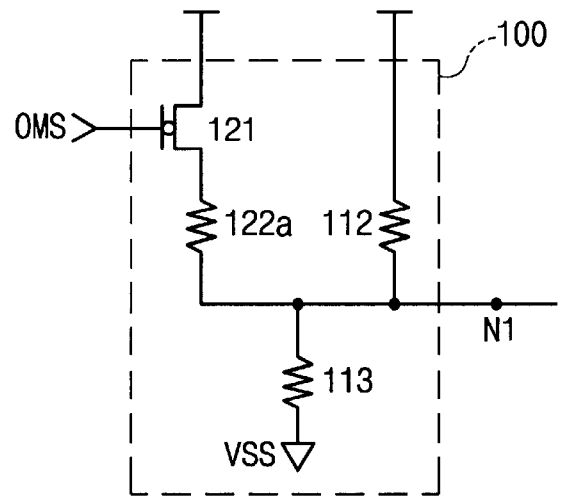
FIG. 3A is a schematic circuit diagram illustrating a second embodiment of a voltage detecting circuit according to the present invention.
Figure 3B:
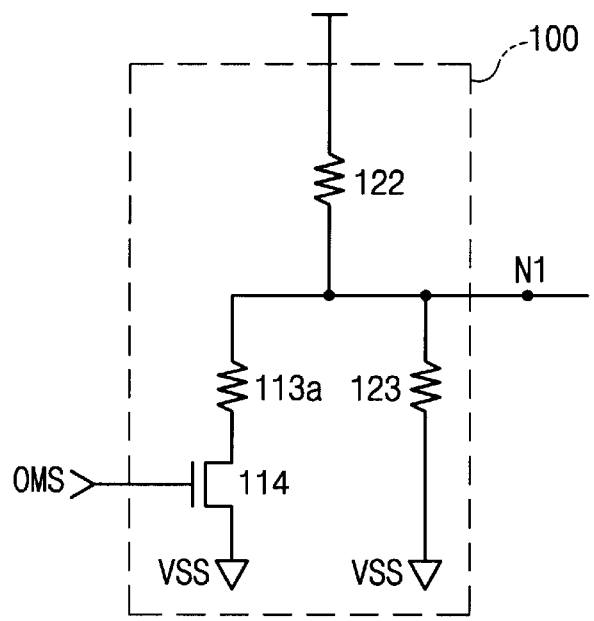
FIG. 3B is a schematic circuit diagram illustrating a third embodiment of a voltage detecting circuit according to the present invention.

FIGS. 3A and 3B illustrate second and third embodiments, respectively, of a voltage detecting circuit according to the present invention. In these two embodiments, only the configuration of the first voltage generator 100 is different from the previous embodiment shown in FIG. 2, illustration and description of the remaining components are therefore omitted for simplicity. In each of these embodiments, the number of switches is reduced in comparison to the first voltage generator 100 of FIG. 2.

In the second embodiment, shown in FIG. 3A, a switch 121 is off in the test mode (OMS=high level) but on in the normal operation mode (OMS=low level). The appropriate reference voltage for the test mode can be provided by adjusting the resistance values of the resistors 112 and 113. Likewise, the appropriate reference voltage for the normal operation mode can be provided by adjusting the resistance value of resistor 122a in relation to the resistance values of resistors 112 and 113. In the third embodiment, shown in FIG. 3B, a switch 114 is on in the test mode (OMS=high level) but off in the normal operation mode (OMS=low level). The appropriate reference voltage for the normal operation mode can be provided by adjusting the resistance values of the resistors 122 and 123. Likewise, the reference voltage appropriate for use in the test mode can be provided by adjusting the resistance value of resistor 113a in relation to the resistance values of resistors 122 and 123.

Variations in the desired target VPP level are generally not proportional to variations in the power supply voltage VDD level in accordance with the transition from the normal operation mode to the test mode. For example, while the power supply voltage VDD level doubles from 3 V in the normal operation mode to 6 V in the test mode, the desired target VPP level does not double between modes. Rather, while the target VPP level in the normal operation mode is about 4 V, a target VPP level of about 7 V is suitable for the test mode.

Because of the linear characteristic of resistors, a single voltage divider cannot provide the appropriate reference voltages for both operation modes. Specifically, if the resistors of the voltage divider are adjusted for the test mode, the reference voltage level generated through those same resistors using the lower power supply voltage VDD level of the normal operation mode is relatively low in comparison to a desired reference voltage for the normal mode. Conversely, when the resistors of the voltage divider are adjusted to provide a reference voltage appropriate for the normal operation mode, the reference voltage level generated through those same resistors by the raised power supply voltage VDD level of the test mode is relatively high in comparison to desired reference voltage for the test mode.

According to the second preferred embodiment, this problem is overcome by providing resistor 122a in parallel with resistor 112 to raise the reference voltage in the normal operation mode. According to the third embodiment, resistor 113a is provided in parallel with the resistor 123 to lower the reference voltage in the test mode and thereby overcome the problem of the prior art.

Figure 4:
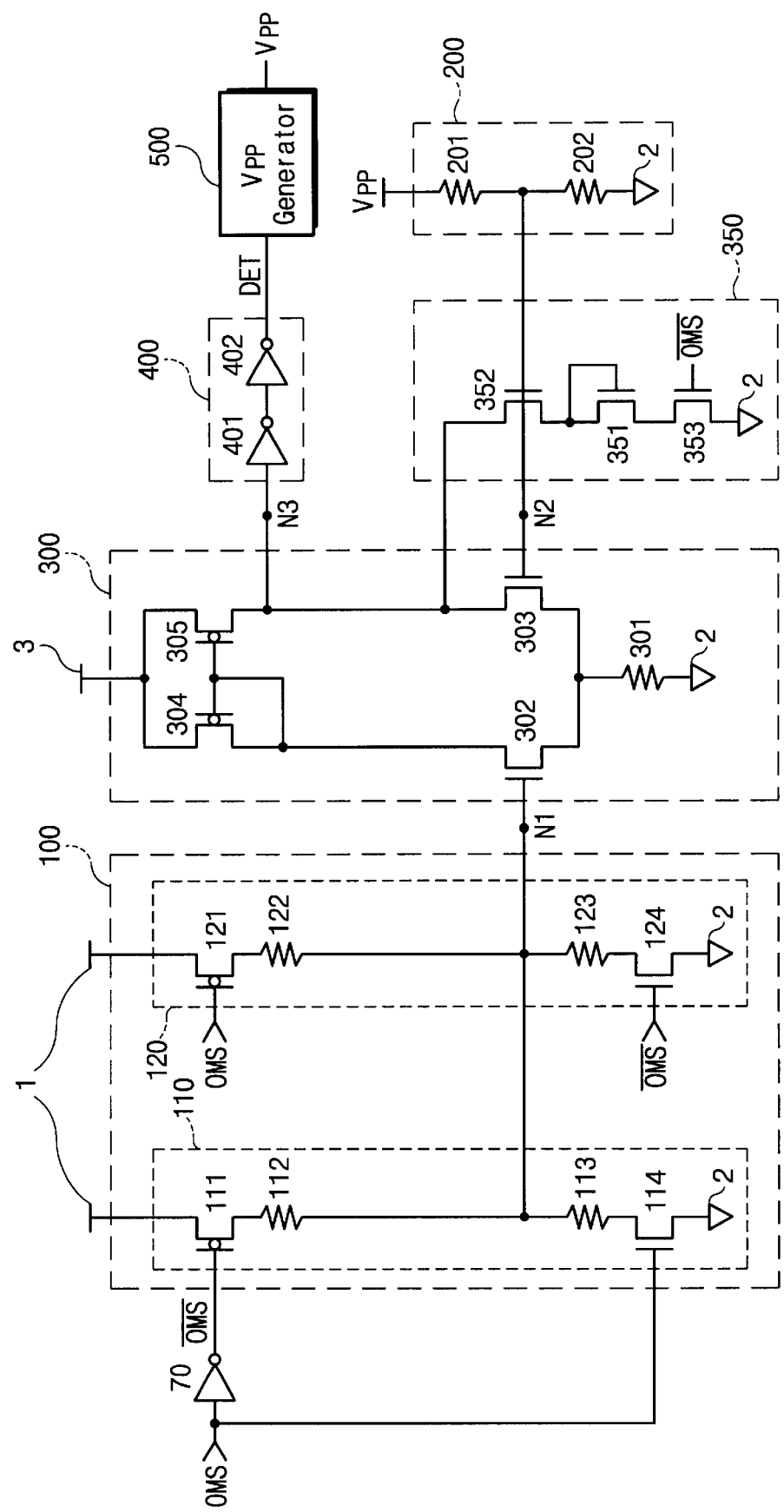
FIG. 4 is a schematic circuit diagram illustrating a fourth embodiment of a voltage detecting circuit according to the present invention.

FIG. 4 illustrates a fourth embodiment of a voltage detecting circuit according to the present invention. Referring to FIG. 4, the overall configuration of the fourth embodiment is similar to the first embodiment shown in FIG. 2, except that a bypass circuit 350 is coupled between the output node N3 and the comparison input N2 of the sense amplifier 300. It should be apparent that the bypass circuit 350 can also be applied to the second and third embodiments of FIGS. 3A and 3B, respectively.

The bypass circuit 350 includes a transistor 352, a diode-connected transistor 351, and a switch 353 coupled together in series between the output N3 of the differential amplifier 300 and the ground voltage 2. A gate of the transistor 352 is coupled to the comparison input N2 of the sense amplifier 300. The switch 353 is controlled by an inverted operation mode signal ( ).

Figure 6A:
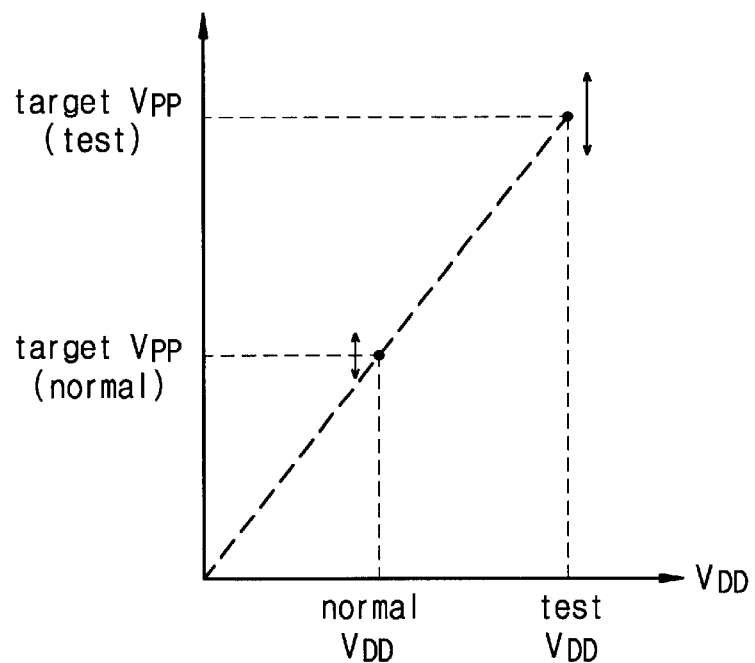
FIG. 6A is a graph illustrating the variations between target VPP levels at both operational modes resulting from process and temperature variations according to the prior art.
Figure 6B:
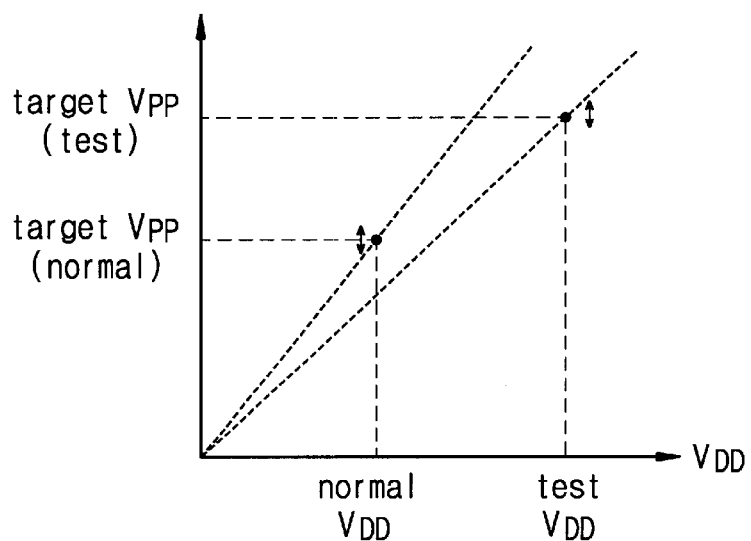
FIG. 6B is a graph illustrating the variations between target VPP levels in both operational modes resulting from process and temperature variations according to one embodiment of the present invention.
Figure 6C:
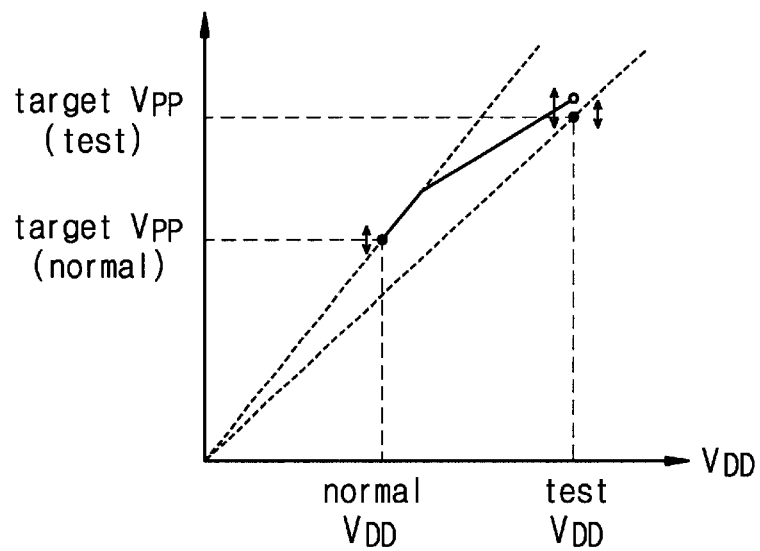
FIG. 6C is a graph illustrating the variations between target VPP levels in both operational modes resulting from process and temperature variations according to another embodiment of the present invention.

Referring additionally to FIG. 6C, the second reference voltage generating circuit 120 is used in a power supply voltage VDD range between the normal power supply voltage VDD and test power supply voltage VDD levels. Because the operation mode signal OMS is maintained low in the power supply voltage VDD range between the normal and test power supply voltage VDD levels, the switch 353 of the bypass circuit 350 is on during that time and thereby activates the bypass circuit 350. As seen from FIG. 6C, the bypass circuit 350 lowers the detected boosted voltage VPP level in the power supply voltage VDD range between the normal and test power supply voltage VDD levels. This embodiment can therefore provide a lower boosted voltage VPP level than the voltage detecting circuits without the bypass circuit 350 in the power supply voltage VDD range between the normal and test power supply voltage VDD levels. The power supply voltage VDD value between the normal and test power supply voltage VDD levels can be used as another test power supply voltage VDD value without adding any additional voltage dividers.

When the power supply voltage VDD level reaches the test power supply voltage VDD value of FIG. 6C, the operation mode signal OMS is changed to a high state and the switch 353 is turned off. When the switch 353 is off, the bypass circuit 350 has no influence on the detection operation, and the target VPP level is obtained only by the first reference voltage generating circuit 110.

When the voltage level of node N2 reaches twice an amount of a threshold voltage (Vt) of transistor 351, the two transistors 351 and 352 are turned on slightly and begin to provide a current path from the output N3 of the differential amplifier 300 to the ground voltage 2. In this embodiment, both transistors 351 and 352 have same threshold voltage because they are the same type of NMOS transistor. When the transistors are turned on, the voltage level of the output N3 of the differential amplifier 300 begins to drain. The voltage level at node N3 in this embodiment is therefore lower than in the embodiments without the bypass circuit. The voltage detection operation in this embodiment can therefore take place at a lower boosted voltage VPP level.

To prevent current from flowing through the bypass circuit 350 in the normal operation mode, the voltage level of node N2 at the target VPP level in the normal operation mode should be lower than twice the threshold voltage Vt of transistor 351. Therefore, the values of resistors 201 and 202 should be determined based on the desired voltage level of node N2 at the target VPP level in the normal operation mode.

Figure 5:
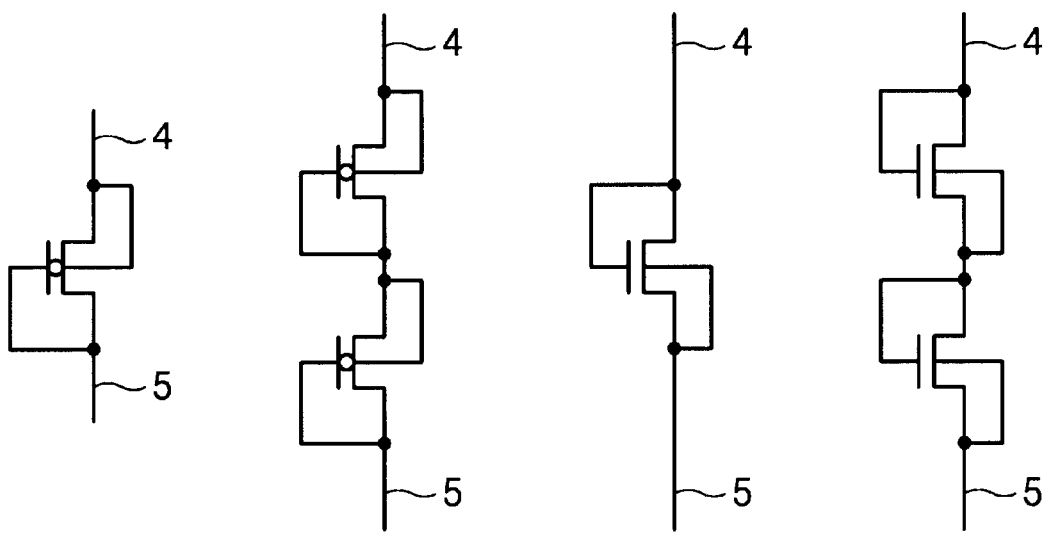
FIG. 5 contains schematic circuit diagrams showing various diode-connected MOS transistors capable of use in the present invention.

FIG. 5 shows various diode-connected MOS transistor configurations that can be used as the resistors of the present invention. Each resistor of the present invention can include one or more diode-connected MOS transistors. Referring to FIG. 5, the gates of the transistors in the PMOS transistor embodiments are connected to a drain 5 having a relatively lower potential. The gates of the transistors in the NMOS transistor embodiments are connected to a drain 4 having a relatively higher potential.

FIGS. 6A, 6B, and 6C are graphs comparing the voltage detection operation of the prior art with those of the various embodiments of this invention. FIG. 6A represents the prior art voltage detection operation and illustrates the variation of the target VPP levels at both the normal and test operational modes resulting from process and temperature variations. FIGS. 6B and 6C are similar graphs for the various embodiments of this invention. FIG. 6B shows the performance of the embodiments without the bypass circuit, while FIG. 6C illustrates the performance of the embodiments with the bypass circuit. As can be seen from a comparison of the graphs, the present invention can detect a target VPP level more precisely and provide a more stable target VPP level than can the prior art.

According each of the foregoing embodiments of the present invention, process and temperature variations cause the reference and comparison voltages to shift in the same direction. The invention therefore continues to provide a stable differential voltage to the differential amplifier 300, regardless of these variations. This stability is provided because the voltage generators 100 and 200 each include all the same type of resistors. For instance, they can all include any one of the resistor types shown in FIG. 5, or any other resistor type, as long as they are all the same (e.g., all resistors made from one or more diode-connected PMOS transistors).

Also advantageous in this invention, the voltage gain of the output node N3 of the differential amplifier 300 in response to the VPP level is so much higher than that of node A in the prior art that the variations in the logic threshold voltage of the inverter 401 can be compensated for. Moreover, each of the reference voltage generating circuits described according to this invention are capable of providing the target VPP levels suitable for both operation modes. And a proper boosted voltage VPP level for another usage can be provided by the bypass circuit in a power supply voltage VDD range between the normal power supply voltage VDD and test power supply voltage VDD levels. Therefore, according to this invention, a precise and stable detecting operation, which is unaffected by process and temperature variations, can be performed in each operation mode.

The foregoing description of the preferred embodiments of the present invention has been presented for purposes of illustration and description only. Numerous modifications and variations of the present invention are possible in light of the teachings presented above. It should therefore be understood that, within the spirit and scope of the appended claims, the present invention can be practiced in numerous manners other than those specifically described herein. The claims should therefore not be construed as being limited to any of these specific embodiments.

What is claimed is:

1. A circuit for a semiconductor memory device comprising:
   a first voltage generator coupled to a first power supply voltage, said first voltage generator configured to provide a reference voltage, wherein the reference voltage is variable in response to an operation mode signal;
   a second voltage generator coupled to a second power supply voltage, said second voltage generator configured to provide a comparison voltage;
   a differential amplifier configured to receive the reference voltage and the comparison voltage and to generate an amplified difference voltage in response to a voltage difference between the reference voltage and the comparison voltage;
   a driving circuit configured to receive the amplified difference voltage and to generate a voltage level detection signal; and
   a third voltage generator configured to generate the second power supply voltage in response to the voltage level detection signal.

2. A circuit according to claim 1, wherein the voltage level detection signal is deactivated when the second power supply voltage reaches a predetermined level.

3. A circuit according to claim 2, wherein the third voltage generator is configured to stop generating the second power supply voltage when the voltage level detection signal is deactivated.

4. A circuit according to claim 1, wherein the second power supply voltage is a boosted voltage of the first power supply voltage.

5. A circuit according to claim 1, wherein the first voltage generator comprises:
   a first reference voltage generating circuit configured to provide a first reference voltage in response to the operation mode signal during a normal operation mode of the semiconductor memory device; and
   a second reference voltage generating circuit configured to provide a second reference voltage in response to the operation mode signal during a test mode of the semiconductor memory device, wherein the first and second reference voltages are each provided to the differential amplifier as the reference voltage relating to the comparison voltage.

6. A circuit according to claim 5, wherein the first reference voltage generating circuit includes a voltage divider and a switch connected together in series between a ground voltage and the first power supply voltage, wherein the switch is configured to be on during the normal operation mode in response to the operation mode signal.

7. A circuit according to claim 5, wherein the second reference voltage generating circuit includes a voltage divider and a switch connected together in series between a ground voltage and the first power supply voltage, wherein the switch is configured to be on during the test mode in response to the operation mode signal.

8. A circuit for a semiconductor memory device comprising:
   a first switch pair comprising a first switch and a second switch, said first switch pair having a first end coupled to a first power supply voltage and a second end connected to a ground voltage;
   a first voltage divider coupled between the first and second switches, said first voltage divider configured to provide a first reference voltage;
   a second switch pair comprising a third switch and a fourth switch, said second switch pair having a first end coupled to the first power supply voltage and a second end coupled to the ground voltage;
   a second voltage divider coupled between the third and fourth switches, said second voltage divider configured to provide a second reference voltage;
   a third voltage divider coupled between a second power supply voltage and the ground voltage, said third voltage divider configured to provide a comparison voltage;
   a differential amplifier configured to selectively receive one of the first and second reference voltages and the comparison voltage, and to generate an amplified difference voltage in response to a voltage difference between the selected one of the reference voltages and the comparison voltage;
   a driving circuit configured to receive the amplified difference voltage and to generate a voltage level detection signal; and
   a voltage generator configured to generate the second power supply voltage in response to the voltage level detection signal, wherein the voltage generator is further configured to stop generating the second power supply voltage upon deactivation of the voltage level detection signal.

9. A voltage detecting circuit for a semiconductor memory device, comprising:
   a first voltage generator coupled to a first power supply voltage, said first voltage generator configured to provide a reference signal in response to an operation mode signal;
   a second voltage generator coupled to a second power supply voltage, said second voltage generator configured to provide a comparison signal;
   a differential amplifier coupled to a third power supply voltage, said differential amplifier having a first input and a second input, wherein the first input is configured to receive the reference signal and the second input is configured to receive the comparison signal, and wherein said differential amplifier is further configured to provide an amplified difference signal in response to a voltage difference between the reference signal and the comparison signal; and
   a driving circuit configured to receive the amplified difference signal and to provide a voltage level detection signal.

10. A voltage detecting circuit according to claim 9, wherein the first and third power supply voltages comprise a power supply voltage for peripheral circuitry, and wherein the second power supply voltage is a boosted voltage.

11. A voltage detecting circuit according to claim 9, wherein the first power supply voltage is power supply voltage for a cell array, the second power supply voltage is a boosted voltage, and the third power supply voltage is a power supply voltage for peripheral circuitry.

12. A voltage detecting circuit according to claim 9, wherein:
   the first voltage generator comprises a first reference voltage generating circuit configured to provide the reference signal during a test mode in response to the operation mode signal, and a second reference voltage generating circuit configured to provide the reference signal during a normal operation mode in response to the operation mode signal;
   the second voltage generator comprises a first resistor and a second resistor connected together in series between the second power supply voltage and a ground voltage; and
   the first and second reference voltage generating circuits are configured to operate in a manner complementary to each other.

13. A voltage detecting circuit according to claim 12, wherein:
   the first reference voltage generating circuit comprises a first serially-connected switch and resistor pair coupled between the first power supply voltage and a first output, and a second serially-connected switch and resistor pair coupled between the first output and the ground voltage;
   the second reference voltage generating circuit comprises a third serially-connected switch and resistor pair coupled between the first power supply voltage and the first output, and a fourth serially-connected switch and resistor pair coupled between the first output and the ground voltage;
   the switches of the first and second reference voltage generating circuits are configured to be turned on and off in response to the operation mode signal;

the switches of the first reference voltage generating circuit are configured to be on during the test mode and off during the normal operation mode; and
   the switches of the second reference voltage generating circuit are configured to be on during the normal operation mode and off during the test mode.

14. A voltage detecting circuit according to claim 13, wherein the second power supply voltage is a boosted voltage.

15. A voltage detecting circuit according to claim 13, wherein all of the resistors comprise diode-connected MOS transistors of same transistor type, and wherein the switches are MOS switches.

16. A voltage detecting circuit for a semiconductor memory device, comprising:
   a first voltage generator comprising a switch and a first resistor coupled together in series between a power supply voltage and a first output, and a second resistor coupled between the first output and a ground voltage, said first voltage generator configured to provide a reference signal to the first output in response to an operation mode signal;
   a second voltage generator comprising a third resistor coupled between a boosted voltage and a second output, and a fourth resistor coupled between the second output and the ground voltage, said second voltage generator configured to provide a comparison signal to the second output;
   a differential amplifier coupled to the power supply voltage, said differential amplifier comprising a first input coupled to the first output and a second input coupled to the second output and configured to provide an amplified difference signal in response to a voltage difference between the first and second inputs; and
   a driving circuit coupled to the amplified difference signal, said driving circuit configured to provide a voltage level detection signal.

17. A voltage detecting circuit according to claim 16, wherein the switch is configured to be on during a normal operation mode, and off during a test mode.

18. A voltage detecting circuit according to claim 16, wherein the resistors each comprise one or more diode-connected MOS transistors of same transistor type, and the switch is a MOS switch.

19. A voltage detecting circuit for a semiconductor memory device, comprising:
   a first voltage generator configured to provide a reference signal to a first output in response to an operation mode signal, said first voltage generator comprising a serially-connected switch and resistor pair coupled between a first output and a ground voltage, a first resistor coupled between a power supply voltage and the first output, and a second resistor coupled between the first output and the ground voltage;
   a second voltage generator configured to provide a comparison signal to a second output, said second voltage generator having a third resistor coupled between a boosted voltage and the second output, and a fourth resistor coupled between the second output and the ground voltage;
   a differential amplifier coupled to the power supply voltage, said differential amplifier comprising a first input coupled to the first output and a second input coupled to the second output and configured to provide an amplified difference signal in response to a voltage difference between the inputs; and a driving circuit coupled to the amplified difference signal, said driving circuit configured to provide a voltage level detection signal.

20. A voltage detecting circuit according to claim 19, wherein the switch is configured to be off during a normal operation mode and on during a test mode.

21. A voltage detecting circuit according to claim 19, wherein the resistors each comprise one or more diode-connected MOS transistors of the same transistor type, and the switch is a MOS switch.

22. A voltage detecting circuit for a semiconductor memory device, comprising:

a first voltage generator coupled to a first power supply voltage, said first voltage generator configured to provide a reference signal in response to an operation mode signal;

a second voltage generator coupled to a second power supply voltage, said second voltage generator configured to provide a comparison signal;

a differential amplifier coupled to a third power supply voltage, said differential amplifier configured to provide an amplified difference signal in response to a voltage difference between the reference and comparison signals;

a bypass circuit coupled to the amplified difference signal of the differential amplifier, said bypass circuit configured to provide a current path to the amplified difference signal in response to the comparison signal and the operation mode signal; and a driving circuit configured to receive the amplified difference signal and to provide a voltage level detection signal.

23. A voltage detecting circuit according to claim 22, wherein the first and third power supply voltages comprise a power supply voltage for peripheral circuitry, and the second power supply voltage comprises a boosted voltage.

24. A voltage detecting circuit according to claim 22, wherein the first power supply voltage comprises a power supply voltage for a cell array, the second power supply voltage comprises a boosted voltage, and the third power supply voltage comprises a power supply voltage for peripheral circuitry.

25. A voltage detecting circuit according to claim 22, wherein the bypass circuit is configured to begin to provide a current path when a voltage level of the comparison signal reaches a predetermined level.

26. A voltage detecting circuit according to claim 22, wherein:

the first voltage generator comprises a first reference voltage generating circuit configured to provide the reference signal during a test mode in response to the operation mode signal, and a second reference voltage generating circuit configured to provide the reference signal during a normal operation mode in response to the operation mode signal;

the second voltage generator comprises a first resistor and a second resistor connected together in series between the second power supply voltage and a ground voltage; and the first and second reference voltage generating circuits are configured to operate complementary to each other.

27. A voltage detecting circuit according to claim 26, wherein:

the bypass circuit comprises a transistor, a diode-connected transistor, and a switch coupled together in series between the amplified difference signal of the differential amplifier and the ground voltage;

the switch is configured to turn on and off in response to the operation mode signal;

the transistors are configured to turn on when a voltage level of the comparison signal reaches a predetermined level; and the bypass circuit is configured to provide a current path when the transistors are turned on.

28. A voltage detecting circuit according to claim 27, wherein:

the first reference voltage generating circuit comprises a first serially-connected switch and resistor pair coupled between the first power supply voltage and a first output, and a second serially-connected switch and resistor pair coupled between the first output and the ground voltage;

the second reference voltage generating circuit comprises a third serially-connected switch and resistor pair coupled between the first power supply voltage and the first output, and a fourth serially-connected switch and resistor pair coupled between the first output and the ground voltage;

the switches are turned on in response to the operation mode signal;

the switches of the first reference voltage generating circuit are configured to be on during the test mode; and the switches of the second reference voltage generating circuit are configured to be on during the normal operation mode.

29. A voltage detecting circuit according to claim 28, wherein the second power supply voltage is a boosted voltage.

30. A voltage detecting circuit according to claim 29, wherein the first resistor, the second resistor, and the resistors of the first and second reference voltage generating circuits each comprise one or more diode-connected MOS transistors of the same transistor type, and wherein each of the switches of the first and second reference voltage generating circuits and the bypass circuit is a MOS switch.

31. A voltage detecting circuit according to claim 30, wherein the transistor and the diode-connected transistor of the bypass circuit are NMOS transistors, and the predetermined level is twice an amount of a threshold voltage of the NMOS transistor.

* * * * *